(12) United States Patent
DeCoste et al.

(10) Patent No.: US 7,656,964 B1
(45) Date of Patent: Feb. 2, 2010

(54) FORWARD AND REVERSE VSWR INSENSITIVE POWER DETECTION USING PHASE SHIFTING AND HARMONIC FILTERING

(75) Inventors: David DeCoste, Hiawatha, IA (US); Andrew F. Folkmann, Cedar Rapids, IA (US); Derek Schooley, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 553 days.

(21) Appl. No.: 11/626,514

(22) Filed: Jan. 24, 2007

(51) Int. Cl.
*H04L 25/49* (2006.01)
*H03F 1/26* (2006.01)
*H04B 1/04* (2006.01)

(52) U.S. Cl. .................. 375/297; 330/149; 330/151; 455/114.3

(58) Field of Classification Search ......... 375/295–297, 375/308; 330/2, 3, 10, 295, 84, 149, 151; 455/114.3
See application file for complete search history.

(56) References Cited

U.S. PATENT DOCUMENTS

| 5,994,965 A | * | 11/1999 | Davis et al. | 330/295 |
| 6,515,544 B1 | * | 2/2003 | Suzuki et al. | 330/151 |
| 7,440,734 B1 | * | 10/2008 | Jones et al. | 455/115.1 |

* cited by examiner

*Primary Examiner*—Young T. Tse
(74) *Attorney, Agent, or Firm*—Withrow & Terranova, P.L.L.C.

(57) ABSTRACT

A system for detecting both forward and reverse power of a power amplifier in the presence of harmonics created by the power amplifier is provided. A forward power detection system receives detection signals from an in-phase amplifier leg and a quadrature-phase amplifier leg of the power amplifier. The forward power detection system applies a phase shift to the detection signals such that forward components of the detection signals are essentially in-phase, and reverse components of the detection signals are essentially 180 degrees out-of-phase. The phase shifted detection signals are then combined and filtered to provide a signal indicative of forward power. In a similar fashion, a reverse power detection system applies a phase shift to the detection signals to provide a signal indicative of reverse power.

20 Claims, 5 Drawing Sheets

FORWARD AND REVERSE VSWR INSENSITIVE POWER DETECTION USING PHASE SHIFTING AND HARMONIC FILTERING

FIELD OF THE INVENTION

The present invention relates to detecting the output power of a mobile terminal, and more specifically relates to a system for detecting forward and reverse output power of a power amplifier in the transmit chain of a mobile terminal that is tolerant to variations in load impedance.

BACKGROUND OF THE INVENTION

The output power of mobile terminals, such as mobile telephones, Personal Digital Assistants (PDAs), and the like, is controlled by a power amplifier in the transmit chain. For open loop power amplifiers, the output power of the power amplifier, and thus the mobile terminal, is a function of the load impedance seen at the output of the power amplifier. Ideally, the load impedance is a constant load. However, in reality, the load impedance may vary due to variations in the impedance of the components in the transmit chain following the power amplifier, such as a duplexer, caused by frequency, temperature, and process variations. The load impedance may also vary due to variations in the impedance of the antenna of the mobile terminal caused by proximity of the antenna to foreign metallic objects and the user's body. For open loop power amplifiers, the variations in the load impedance may result in variations in the output power of the power amplifier. Such output power variations decrease the quality of service (QoS), increase the probability of dropped calls in fringe areas, increase the liability of mobile terminal manufacturers in terms of tolerated output power versus Specific Absorption Ratio (SAR), and increase the peak current of the power amplifier.

In order to reduce output power variations due to variations in the load impedance, it is desirable to detect the output power of the power amplifier. Traditional approaches for detecting the output power use a directional coupler at the output of the power amplifier to provide a signal representative of the output of the power amplifier. A power detector then processes the signal to detect the output power of the power amplifier. However, the directional coupler is an additional component that increases the cost of manufacturing the mobile terminal. In addition, the directional coupler adds loss to the transmit path, thereby decreasing the efficiency of the mobile terminal. Other approaches for detecting the output power may eliminate the directional coupler, but may be susceptible to harmonics in the power signals. Thus, there remains a need for a system for detecting the output power of a power amplifier that is tolerant to variations in load impedance, is tolerant of harmonics in the power signals, and eliminates the need for a directional coupler.

SUMMARY OF THE INVENTION

The present invention provides a system and method for detecting both the forward and reverse power of a power amplifier in the presence of harmonics created by the power amplifier. In general, a forward power detection system receives a first detection signal from an output of an in-phase amplifier leg of the power amplifier and a second detection signal from an output of a quadrature-phase amplifier leg of the power amplifier. The forward power detection system applies a phase shift to at least one of the first and second detection signals such that forward components of the first and second detection signals are essentially in-phase, and reverse components of the first and second detection signals are essentially 180 degrees out-of-phase. The phase shifted detection signals are then combined and filtered to provide a signal indicative of forward power. In a similar fashion, a reverse power detection system applies a phase shift to the first and second detection signals to provide a signal indicative of reverse power.

More specifically, the power amplifier includes a quadrature splitter, in-phase and quadrature-phase amplifier legs, and a quadrature combiner. The quadrature splitter receives a radio frequency (RF) input signal and provides an in-phase RF input signal and a quadrature-phase RF input signal, where the in-phase RF input signal lags the quadrature-phase RF input signal by essentially 90 degrees. The in-phase amplifier leg amplifies the in-phase RF input signal to provide an amplified in-phase signal, and the quadrature-phase amplifier leg amplifies the quadrature-phase RF input signal to provide an amplified quadrature-phase signal. The quadrature combiner combines the amplified in-phase and quadrature-phase signals to provide an RF output signal.

According to the present invention, the forward power detection system is coupled to the output of the in-phase amplifier leg to receive the first detection signal, and is coupled to the output of the quadrature-phase amplifier to receive the second detection signal. The first detection signal includes a forward component indicative of the amplified in-phase signal and a reverse component indicative of a reflected signal. The reflected signal is a signal that is reflected back into the power amplifier due to variations in load impedance seen by the power amplifier based on an ideal load impedance. The second detection signal includes a forward component indicative of the amplified quadrature-phase signal and a reverse component indicative of the reflected signal. Due to a phase shift created by the quadrature combiner, the reverse component of the first detection signal leads the reverse component of the second detection signal by essentially 90 degrees, whereas the forward component of the first detection signal lags the forward component of the second detection signal by essentially 90 degrees.

The forward power detection system applies a phase shift to one or more of the first and second detection signals such that the forward component of the first detection signal is essentially in-phase with the forward component of the second detection signal, and the reverse component of the first detection signal is essentially 180 degrees out-of-phase with the reverse component of the second detection signal. In one embodiment, a +45 degree phase shift is applied to the first detection signal, and a −45 degree phase shift is applied to the second detection signal. The phase shifted detection signals are combined to provide a signal indicative of forward power. The reverse components of the first and second detection signals cancel when combined because they are essentially 180 degrees out-of-phase.

The reverse power detection system is also coupled to the output of the in-phase amplifier leg to receive the first detection signal, and is coupled to the output of the quadrature-phase amplifier to receive the second detection signal. The reverse power detection system applies a phase shift to one or more of the first and second detection signals such that the reverse component of the first detection signal is essentially in-phase with the reverse component of the second detection signal, and the forward component of the first detection signal is essentially 180 degrees out-of-phase with the forward component of the second detection signal. In one embodiment, a −45 degree phase shift is applied to the first detection signal, and a +45 degree phase shift is applied to the second detection signal. The phase shifted detection signals are combined to provide a signal indicative of reverse power. The forward components of the first and second detection signals cancel when combined because they are essentially 180 degrees out-of-phase. Harmonic filters remove undesirable harmonics of the first and second detection signals in both the forward and reverse power detection systems.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
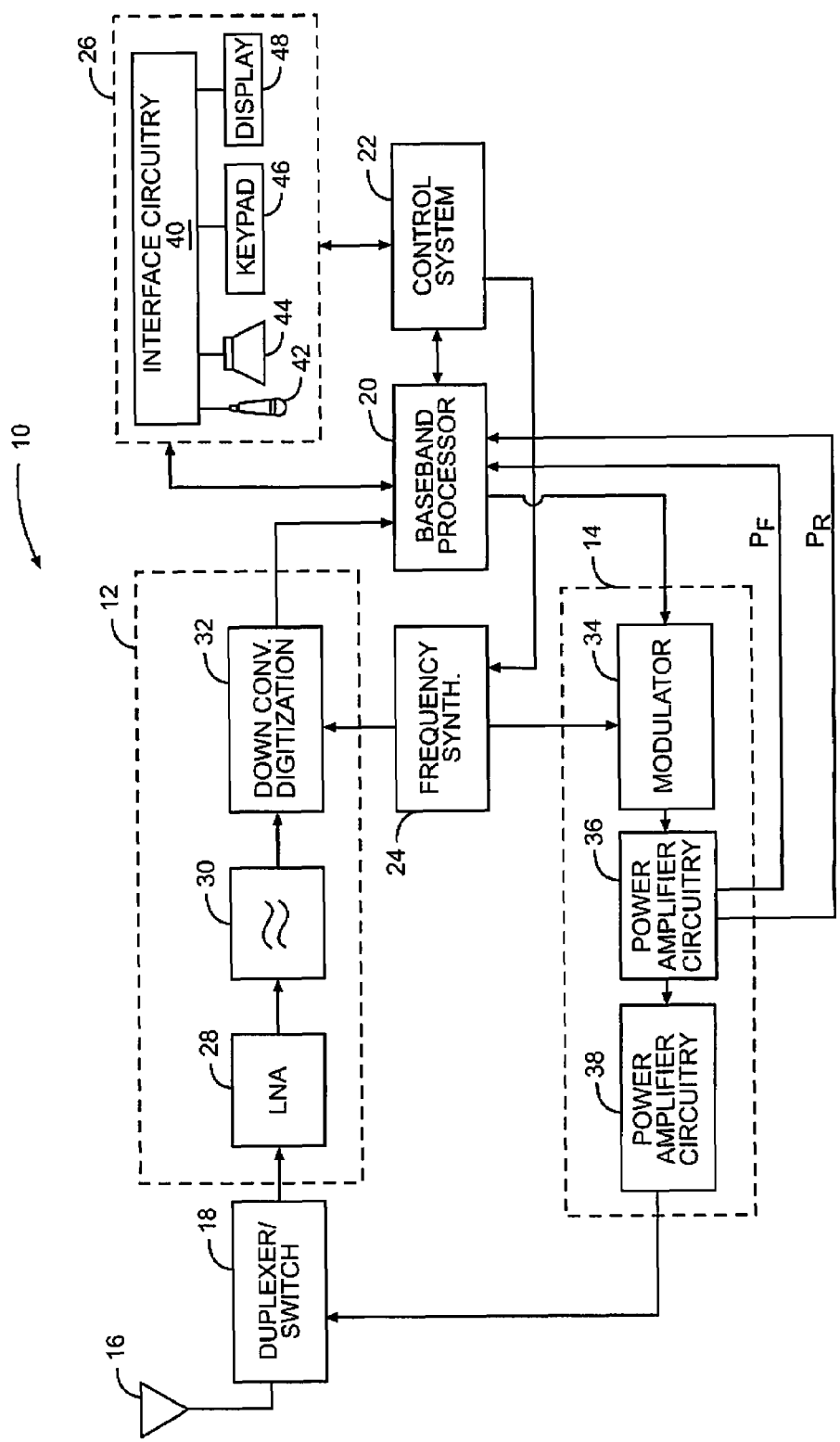
FIG. 1 illustrates a basic block diagram of a mobile terminal according to one embodiment of the present invention.

The present invention may be incorporated in a mobile terminal 10, such as a mobile telephone, wireless personal digital assistant, wireless Local Area Network (LAN) device, wireless base station, or like wireless communication device. The basic architecture of the mobile terminal 10 is represented in FIG. 1 and may include a receiver front end 12, a radio frequency transmitter section 14, an antenna 16, a duplexer or switch 18, a baseband processor 20, a control system 22, a frequency synthesizer 24, and an interface 26. The receiver front end 12 receives information bearing radio frequency signals from one or more remote transmitters provided by a base station. A low noise amplifier 28 amplifies the signal. A filter circuit 30 minimizes broadband interference in the received signal, while downconversion and digitization circuitry 32 downconverts the filtered, received signal to an intermediate or baseband frequency signal, which is then digitized into one or more digital streams. The receiver front end 12 typically uses one or more mixing frequencies generated by the frequency synthesizer 24. The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data, which may represent voice, data, or control information, from the control system 22, which it encodes for transmission. The encoded data is output to the radio frequency transmitter section 14, where it is used by a modulator 34 to modulate a carrier signal that is at a desired transmit frequency. Power amplifier circuitry 36 amplifies the modulated carrier signal to a level appropriate for transmission, and delivers the modulated carrier signal to the antenna 16 through a matching network 38 and duplexer or switch 18.

A user may interact with the mobile terminal 10 via the interface 26, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20. The microphone 42 will typically convert audio input, such as the user's voice, into an electrical signal, which is then digitized and passed directly or indirectly to the baseband processor 20. Audio information encoded in the received signal is recovered by the baseband processor 20 and converted by the interface circuitry 40 into an analog signal suitable for driving the speaker 44. The keypad 46 and display 48 enable the user to interact with the mobile terminal 10, input numbers to be dialed, address book information, or the like, as well as monitor call progress information.

The present invention provides an efficient way to detect the transmit power provided by the power amplifier circuitry 36 that is tolerant to variations in load impedance seen at the input to the duplexer or switch 18 resulting from changes in frequency, temperature, and the environment to which the antenna 16 is exposed. A signal indicative of forward power, referred to as a forward power detection signal ($P_F$), and a signal indicative of reverse power, referred to as a reverse power detection signal ($P_R$), are generated in the power amplifier circuitry 36 and fed back to the control system 22, which will react accordingly to control input signal levels, bias, gain, or a combination thereof in traditional fashion to control transmit power. Note that in the linear domain, rather than the logarithmic domain, forward power minus reverse power is equal to delivered power.

Figure 2:
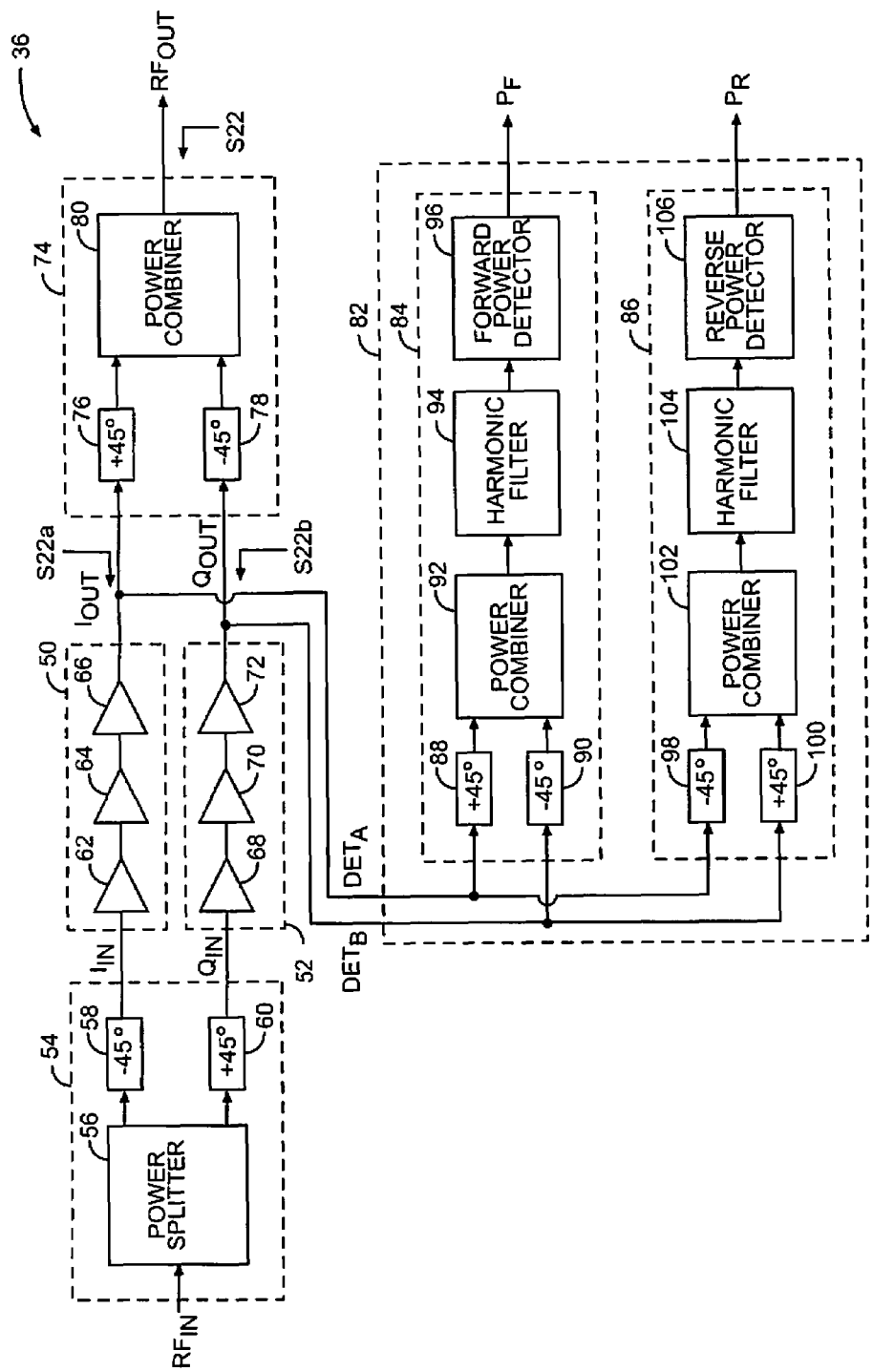
FIG. 2 illustrates power amplifier circuitry including circuitry for detecting forward and reverse power according to one embodiment of the present invention.

As illustrated in FIG. 2, the power amplifier circuitry 36 is a balanced amplifier including an in-phase amplifier leg 50 and a quadrature-phase amplifier leg 52. A radio frequency (RF) input signal ($RF_{IN}$) from the modulator 34 (FIG. 1) is provided to a quadrature splitter 54. As illustrated, the quadrature splitter 54 includes a power splitter 56 and phase shift circuits 58, 60. The power splitter 56 splits the RF input signal ($RF_{IN}$) into two signals having essentially the same power. A first of these two signals may be processed by the −45 degree phase shift circuit 58 to provide an in-phase input signal ($I_{IN}$), and a second of these two signals may be processed by the +45 degree phase shift circuit 60 to provide a quadrature-phase input signal ($Q_{IN}$).

The in-phase input signal ($I_{IN}$) is provided to the in-phase amplifier leg 50, and the quadrature-phase input signal ($Q_{IN}$) is provided to the quadrature-phase amplifier leg 52. The in-phase amplifier leg 50 includes an input amplifier stage 62, an intermediate amplifier stage 64, and a final amplifier stage 66. It should be noted that the in-phase amplifier leg 50 may include any number of amplifier stages. Similarly, the quadrature-phase amplifier leg 52 includes an input amplifier stage 68, an intermediate amplifier stage 70, and a final amplifier stage 72. The quadrature-phase amplifier leg 52 may also include any number of amplifier stages.

The output signals ($I_{OUT}$, $Q_{OUT}$) of the amplifier legs 50, 52 are provided to a quadrature combiner 74, which combines the output signals ($I_{OUT}$, $Q_{OUT}$) to provide an RF output signal ($RF_{OUT}$) to the matching network 38 (FIG. 1). In one embodiment, the quadrature combiner 74 may be implemented using phase shift circuits 76, 78 and a power combiner 80. In general, the +45 degree phase shift circuit 76 operates to shift the phase of the in-phase output signal ($I_{OUT}$) by +45 degrees such that the in-phase output signal ($I_{OUT}$) has a 0 degree phase shift with respect to the RF input signal ($RF_{IN}$). The −45 degree phase shift circuit 78 operates to shift the phase of the quadrature-phase output signal ($Q_{OUT}$) by −45 degrees such that the quadrature-phase output signal ($Q_{OUT}$) has a 0 degree phase shift with respect to the RF input signal ($RF_{IN}$). As a result, the phase shifted in-phase and quadrature-phase output signals ($I_{OUT}$, $Q_{OUT}$) are in-phase and are combined by the power combiner 80 to provide the RF output signal ($RF_{OUT}$).

As the load impedance seen at the antenna 16 (FIG. 1) varies, the output of the power amplifier circuitry 36 and the currents through the amplifier legs 50, 52 also vary. However, since the power amplifier circuitry 36 is a balanced amplifier, the total current drawn by the final amplifier stages 66, 72 is relatively constant as the load impedance varies for a given output power level, as will be apparent to one of ordinary skill in the art upon reading this disclosure. More specifically, when the quadrature splitter 54 divides the input signal into two equal amplitude outputs and the amplifier legs 50, 52 are of comparable design, the output return loss (S22) of the power amplifier circuitry 36 is defined as:

$$|S22| = 0.5 \times |S22a - S22b|, \quad \text{Eq. 1}$$

where S22a is the output return loss of the in-phase amplifier leg 50, and S22b is the output return loss of the quadrature-phase amplifier leg 52. Thus, when the amplifier legs 50, 52 are matched, the output return losses (S22a, S22b) of the amplifier legs 50, 52 are approximately equal, and the output return loss (S22) of the power amplifier circuitry 36 is approximately zero. As a result, even though the currents in the amplifier legs 50, 52 vary, the total current drawn by the final amplifier stages 66, 72 is relatively constant as the load impedance varies for a given output power level, and power detection system 82 is tolerant to variations in VSWR.

According to the present invention, a power detection system 82 is coupled to the outputs of the in-phase and quadrature-phase amplifier legs 50, 52, and operates to generate the forward power detection signal ($P_F$) and the reverse power detection signal ($P_R$). The power detection system 82 includes a forward power detection system 84 and a reverse power detection system 86.

In the illustrated embodiment, the forward power detection system 84 includes a +45 degree phase shift circuit 88, a −45 degree phase shift circuit 90, a power combiner 92, a harmonic filter 94, and a forward power detector 96. The +45 degree phase shift circuit 88 is coupled to an output of the in-phase amplifier leg 50 such that a first detection signal ($DET_A$) is provided to the +45 degree phase shift circuit 88. The first detection signal ($DET_A$) includes a forward component and a reverse component. The forward component is indicative of the amplified in-phase RF input signal provided by the in-phase amplifier leg 50. The reverse component is indicative of a reflected signal that is reflected back into the output of the quadrature combiner 74 due to variations in the load impedance. When the load impedance is equal to the ideal load impedance, the reverse component of the first detection signal ($DET_A$) is zero.

Similarly, the −45 degree phase shift circuit 90 is coupled to an output of the quadrature-phase amplifier leg 52 such that a second detection signal ($DET_B$) is provided to the −45 degree phase shift circuit 90. The second detection signal ($DET_B$) includes a forward component and a reverse component. The forward component is indicative of the amplified quadrature-phase RF input signal provided by the quadrature-phase amplifier leg 52. The reverse component is indicative of the reflected signal that is reflected back into the output of the quadrature combiner 74 due to variations in the load impedance. When the load impedance is equal to the ideal load impedance, the reverse component of the second detection signal is zero.

Looking at the forward components of the first and second detection signals ($DET_A$, $DET_B$), the phase of the forward component of the first detection signal ($DET_A$) is shifted by +45 degrees by the phase shift circuit 88, and the phase of the forward component of the second detection signal ($DET_B$) is shifted by −45 degrees by the phase shift circuit 90 such that the forward components of the first and second detection signals ($DET_A$, $DET_B$) are in-phase with one another and are combined by a power combiner 92. As for the reverse components of the first and second detection signals ($DET_A$, $DET_B$), the reverse component of the first detection signal ($DET_A$) has a phase shift of +45 degrees with respect to the RF output signal ($RF_{OUT}$) due to the +45 degree phase shift circuit 76 of the quadrature combiner 74. The phase of the reverse component of the first detection signal ($DET_A$) is shifted by an additional +45 degrees by the phase shift circuit 88. As such, the reverse component of the first detection signal ($DET_A$) is shifted by +90 degrees with respect to the RF output signal ($RF_{OUT}$).

The reverse component of the second detection signal ($DET_B$) has a phase shift of −45 degrees with respect to the RF output signal ($RF_{OUT}$) due to the −45 degree phase shift circuit 78 of the quadrature combiner 74. The phase of the reverse component of the second detection signal ($DET_B$) is shifted by an additional −45 degrees by the phase shift circuit 90. As such, the reverse component of the second detection signal ($DET_A$) is shifted by −90 degrees with respect to the RF output signal ($RF_{OUT}$) and is 180 degrees out-of-phase with the reverse component of the first detection signal ($DET_A$). As a result, the reverse components of the first and second detection signals ($DET_A$, $DET_B$) cancel when combined by the power combiner 92, and the output of the power combiner 92 is an indication of only forward power. Thus, the forward power detection system 84 is said to have directivity.

The harmonic filter 94 receives the output of the power combiner 92, and removes harmonics of $RF_{IN}$. In an ideal amplifier, the harmonic filter 94 would be unnecessary; however, the phase shifting circuits 58, 60, 76, 78, 88, 90, the power combiners 80, 92, and the active components of the amplifier legs 50, 52 can introduce harmonics into the power amplifier circuitry 36. Harmonics degrade the ability of the forward power detection system 84 to differentiate between the forward components and the reverse components of the detection signals; therefore, harmonics should be eliminated for optimal operation of the forward power detection system 84. The harmonic filter 94 may be formed using a low pass filter or a bandpass filter and may be implemented in any manner known in the art. The forward power detector 96 receives the output of the harmonic filter 94, and generates the forward power detection signal ($P_F$), which is indicative of only the forward power. The forward power detector 96 may be implemented in any manner known in the art. For example, the forward power detector 96 may be similar to that disclosed in commonly owned and assigned U.S. patent application Ser. No. 11/067,800, entitled VSWR TOLERANT POWER DETECTOR, filed Feb. 28, 2005, which is incorporated herein by reference in its entirety.

The reverse power detection system 86 includes a −45 degree phase shift circuit 98, a +45 degree phase shift circuit 100, a power combiner 102, a harmonic filter 104, and a reverse power detector 106. The −45 degree phase shift circuit 98 is coupled to the output of the in-phase amplifier leg 50 such that the first detection signal ($DET_A$) is provided to the −45 degree phase shift circuit 98. Similarly, the +45 degree phase shift circuit 100 is coupled to an output of the quadrature-phase amplifier leg 52 such that the second detection signal ($DET_B$) is provided to the +45 degree phase shift circuit 100. As discussed above, the first and second detection signals ($DET_A$, $DET_B$) each includes a forward component and a reverse component.

Looking at the forward components of the first and second detection signals ($DET_A$, $DET_B$), the forward component of the first detection signal ($DET_A$) is −90 degrees out-of-phase with the forward component of the second detection signal ($DET_B$) as a result of the quadrature splitter 54. In other words, the forward component of the first detection signal ($DET_A$) lags the forward component of the second detection signal ($DET_B$) by 90 degrees. The phase of the forward component of the first detection signal ($DET_A$) is shifted by −45 degrees by the phase shift circuit 98, and the phase of the forward component of the second detection signal ($DET_B$) is shifted by +45 degrees by the phase shift circuit 100, such that the forward components of the first and second detection signals ($DET_A$, $DET_B$) are 180 degrees out-of-phase with one another. As a result, the forward components of the first and second detection signals ($DET_A$, $DET_B$) cancel when combined by the power combiner 102 such that the output of the power combiner 102 is indicative of only reverse power, and the reverse power detection system 86 is said to have directivity.

As for the reverse components of the first and second detection signals ($DET_A$, $DET_B$), the reverse component of the first detection signal ($DET_A$) has a phase shift of +90 degrees with respect to the reverse component of the second detection signal ($DET_B$) due to the quadrature combiner 74. The phase of the reverse component of the first detection signal ($DET_A$) is shifted by −45 degrees by the phase shift circuit 98, and the phase of the reverse component of the second detection signal is shifted by +45 degrees by the phase shift circuit 100. As a result, the reverse components of the first and second detection signals ($DET_A$, $DET_B$) are in-phase and are combined by the power combiner 102 to provide a signal indicative of only reverse power to the reverse power detector 106.

The harmonic filter 104 receives the output of the power combiner 102, and removes harmonics of $RF_{IN}$. In an ideal amplifier, the harmonic filter 104 would be unnecessary; however, the phase shifting circuits 58, 60, 76, 78, 98, 100, the power combiners 80, 102, and the active components of the amplifier legs 50, 52 can introduce harmonics into the power amplifier circuitry 36. Harmonics degrade the ability of the reverse power detection system 86 to differentiate between the forward components and the reverse components of the detection signals; therefore, harmonics should be eliminated for optimal operation of the reverse power detection system 86. The harmonic filter 104 may be formed using a low pass filter or a bandpass filter and may be implemented in any manner known in the art.

The reverse power detector 106 receives the output of the harmonic filter 104, and generates the reverse power detection signal ($P_R$), which is indicative of only the reverse power. The reverse power detector 106 may be implemented in any manner known in the art.

The input amplifier stages 62, 68, the intermediate amplifier stages 64, 70, and the final amplifier stages 66, 72 may be formed by a transistor array such as that described in U.S. Pat. Nos. 5,608,353, entitled HBT POWER AMPLIFIER, issued Mar. 4, 1997; and 5,629,648, entitled HBT POWER AMPLIFIER, issued May 13, 1997, which are commonly owned and assigned, the disclosures of which are incorporated herein by reference in their entireties. The in-phase and quadrature-phase amplifier legs 50, 52 may also include bias networks that provide the bias signals to each of the amplifier stages 62-66 or 68-72, respectively. Exemplary bias networks capable of being used in association with the present invention are described in further detail in commonly owned and assigned U.S. Pat. No. 6,313,705, entitled BIAS NETWORK FOR HIGH EFFICIENCY RF LINEAR POWER AMPLIFIER, issued Nov. 6, 2001, the disclosure of which is incorporated herein by reference in its entirety. Upon understanding the present invention, those skilled in the art will be able to construct any number of bias networks that are compatible with the present invention.

The first and second detection signals ($DET_A$, $DET_B$) will vary with changes in the loading of $RF_{OUT}$ of the quadrature combiner 74. When the loading of $RF_{OUT}$ is an ideal value, such as 50 ohms, $RF_{OUT}$ includes an amplified in-phase signal; however, there is no reflected signal. Therefore, the forward power detection signal ($P_F$) should be a representation of the power delivered from the quadrature combiner 74, and the reverse power detection signal ($P_R$) should be zero since there is no reflected signal. This will occur when the first and second detection signals ($DET_A$, $DET_B$) are in phase with the in-phase and quadrature-phase input signals ($I_{IN}$, $Q_{IN}$) respectively and have the same amplitude. Since $I_{IN}$ is shifted by −45 degrees from the RF input signal $RF_{IN}$, $I_{IN}$ can be represented as K2(1−j). Likewise, since $Q_{IN}$ is shifted by +45 degrees from the RF input signal $RF_{IN}$, $Q_{IN}$ can be represented as K2(1+j). Mathematically:

If $I_{IN}=K_2(1-j)$, then $DET_A=K_3(1-j)$, and

If $Q_{IN}=K_2(1+j)$, then $DET_B=K_3(1+j)$, and

If $P_F=K_4(DET_A)(1+j)+K_4(DET_B)(1-j)$, then $P_F=K_4(K_3)(1-j)(1+j)+K_4(K_3)(1+j)(1-j)$ $P_F=4(K_4)(K_3)$, and If $P_R=K_4(DET_A)(1-j)+K_4(DET_B)(1+j)$, then $P_R=K_4(K_3)(1-j)(1-j)+K_4(K_3)(1+j)(1+j)$ $P_R=K_4(K_3)(-2j)+K_4(K_3)(+2j)$ $P_R=0$   Eq.2

When the loading of $RF_{OUT}$ is an open circuit, the reflected signal is the same magnitude as the amplified in-phase signal; therefore, the forward power detection signal ($P_F$) should be a representation of the power delivered from the quadrature combiner 74 and the reverse power detection signal ($P_R$)

should be identical to $P_F$. This will occur when the first and second detection signals ($DET_A$, $DET_B$) are in phase with each other and have the same amplitude. Mathematically:

If $I_{IN}=K_2(1-j)$, then $DET_A=K_5$, and

If $Q_{IN}=K_2(1+j)$, then $DET_B=K_5$, and $P_F=K_4(DET_A)(1+j)+K_4(DET_B)(1-j)$, therefore $P_F=K_4(K_5)(1+j)+K_4(K_5)(1-j)$ $P_F=2(K_4)(K_3)$, and $P_R=K_4(DET_A)(1-j)+K_4(DET_B)(1+j)$, therefore $P_R=K_4(K_5)(1-j)+K_4(K_5)(1+j)$ $P_R=2(K_4)(K_3)$; therefore $P_F=P_R$         Eq. 3

Figure 3:
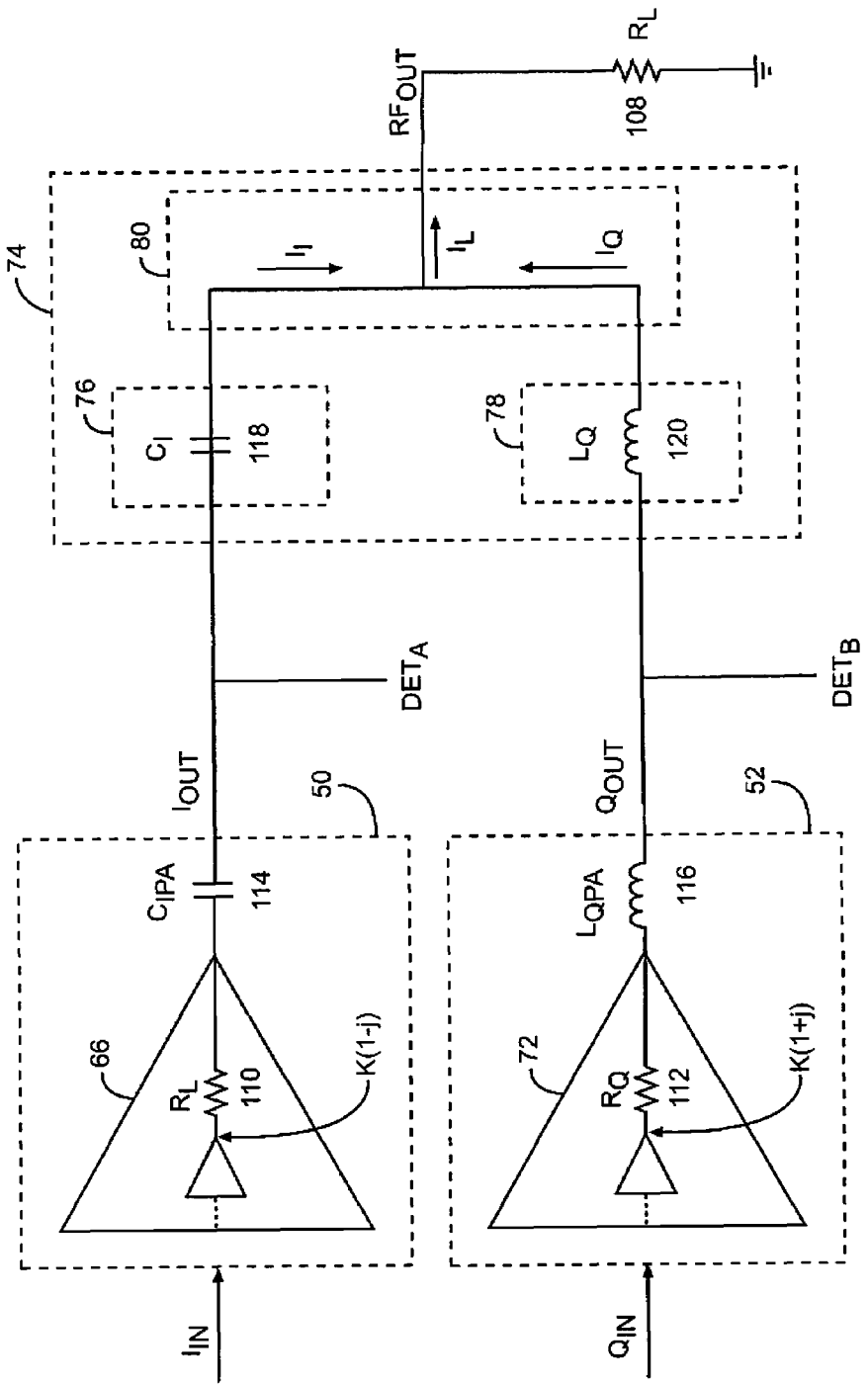
FIG. 3 shows a simplified detailed example of output circuitry of the power amplifier circuitry of FIG. 2 to illustrate phase shift behaviors of forward and reflected signals.

FIG. 3 shows a detailed simplified example of how the phase of the first and second detection signals ($DET_A$, $DET_B$) vary with changes in the loading of $RF_{OUT}$ of the quadrature combiner 74. The loading of $RF_{OUT}$ is represented by a load resistor ($R_L$) 108. The final amplifier stage 66 of the in-phase amplifier leg 50 has an output impedance represented by a resistor ($R_I$) 110. Since the amplifier stages 62, 64, 66 (FIG. 2) of the in-phase amplifier leg 50 do not change the phase of the input signal ($I_{IN}$), and since $I_{IN}$ can be mathematically represented as $K2(1-j)$, the output signal of the final amplifier stage 66 upstream of $R_I$ 110 can be mathematically represented as $K(1-j)$. Likewise, the final amplifier stage 72 of the quadrature-phase amplifier leg 52 has an output impedance represented by a resistor ($R_Q$) 112. Since the amplifier stages 68, 70, 72 (FIG. 2) of the quadrature-phase amplifier leg 52 do not change the phase of the input signal ($Q_{IN}$), and since $Q_{IN}$ can be mathematically represented as $K2(1+j)$, the output signal of the final amplifier stage 72 upstream of $R_Q$ 112 can be mathematically represented as $K(1+j)$. A capacitor ($C_{IPA}$) 114 is added to the in-phase signal path to correct the phase shift developed across $R_I$ 110. The capacitive reactance ($X_{CIPA}$) of $C_{IPA}$ 114 is equal to the resistance of $R_I$ 110. An inductor ($L_{QPA}$) 116 is added to the quadrature-phase signal path to correct the phase shift developed across $R_Q$ 112. The inductive reactance ($X_{LQPA}$) of $L_{QPA}$ 116 is equal to the resistance of $R_Q$ 112. A capacitor ($C_I$) 118 forms the +45 degree phase shift circuit 76 of the quadrature combiner 74. An inductor ($L_Q$) 120 forms the −45 degree phase shift circuit 78 of the quadrature combiner 74. In this simplified example, the power combiner 80 is provided by attaching the output of the +45 degree phase shift circuit 76 to the output of the −45 degree phase shift circuit 78 to form $RF_{OUT}$.

The value of $RF_{OUT}$ can be calculated using the circuit components of FIG. 3. In this example:

The capacitive reactance of $C_{IPA}$ is $X_{CIPA}=1/2\pi f C_{IPA}$.
The capacitive reactance of $C_I$ is $X_{CI}=1/2\pi f C_I$.
The inductive reactance of $L_{QPA}$ is $X_{LQPA}=2\pi f L_{QPA}$.
The inductive reactance of $L_Q$ is $X_{LQ}=2\pi f L_Q$.
$C_I$ and $L_Q$ are chosen such that $X_{CI}=X_{LQ}=2R_L$ ideal=100 ohms.

In this example, $R_I=R_Q=20$ ohms.
$C_{IPA}$ and $L_{QPA}$ are chosen such that $X_{LQPA}=X_{CIPA}=R_I=R_Q=20$ ohms.
A substitution variable called R is defined as $R=R_I=R_Q=20$ ohms.
A substitution variable called $R_{SUB}$ is defined as $R_{SUB}=X_{CI}+X_{CIPA}=X_{LQ}+X_{LQPA}=120$ ohms.
$V_I$ is defined as the voltage across $C_I$, $C_{IPA}$, and $R^I$.
$V_Q$ is defined as the voltage across $L_Q$, $L_{QPA}$, and $R_Q$.

Using Kirchoff's current law:

$I_L=I_I+I_Q$, then $RF_{out}/R_L=[V_I/(R-jX_{CIPA}-jX_{CI})]+[V_Q/(R+jX_{LQPA}+jX_{LQ})]$, then $RF_{out}/R_L=[(K(1-j)-RF_{out})/(R-jX_{CIPA}-jX_{CI})]+[(K(1+j)-RF_{out})/(R+jX_{LQPA}+jX_{LQ})]$, which reduces to $RF_{out}=[2KR_L(R+R_{SUB})/(R^2+R_{SUB}^2+2R_LR)]+0j$.         Eq. 4

$RF_{out}$ is in phase with $RF_{IN}$ for all values of $R_L$; therefore, the quadrature combiner 74 functions properly.

When $R_L$ 108 is an ideal value, such as 50 ohms in this example, $RF_{OUT}$ includes an amplified in-phase signal; however, there is no reflected signal. Therefore, the first and second detection signals ($DET_A$, $DET_B$) must be in phase with the in-phase and quadrature-phase input signals ($I_{IN}$, $Q_{IN}$) respectively and must have the same amplitude to provide proper forward power and reverse power detection signals ($P_F$, $P_R$). The first and second detection signals ($DET_A$, $DET_B$) can be calculated using the circuit components of FIG. 3 as follows:

$RF_{out}=[2KR_L(R+R_{SUB})/(R^2+R_{SUB}^2+2R_LR)]+0j$, from above, and since $R_L=R_L$ ideal=50 ohms, then $R_{SUB}=2R_L+R=120$ ohms, then $RF_{out}=2KR_L/(2R_L+R)=100K/120=5K/6$, and $I_I=I_Q=K/R_{SUB}=K/120$, then $DET_A=RF_{out}+I_I(-jX_{CI})=5K/6+(K/120)(-j100)=5K/6(1-j)$, and $DET_B=RF_{out}+I_Q(jX_{LQ})=5K/6+(K/(120)(j100)=5K/6(1+j)$.         Eq. 5

Therefore, the first and second detection signals ($DET_A$, $DET_B$) are in phase with the in-phase and quadrature-phase input signals ($I_{IN}$, $Q_{IN}$) respectively and have the same amplitude.

When $R_L$ 108 is an open circuit, the reflected signal is the same magnitude as the amplified in-phase signal; therefore, the first and second detection signals ($DET_A$, $DET_B$) must be in phase with each other and must have the same amplitude to provide proper forward power and reverse power detection signals ($P_F$, $P_R$). The first and second detection signals ($DET_A$, $DET_B$) can be calculated using the circuit components of FIG. 3 as follows:

$RF_{out}=[2KR_L(R+R_{SUB})/(R^2+R_{SUB}^2+2R_LR)]+0j$, from above, and since $R_L$=open circuit=∞, and $R_{SUB}$=120 ohms, then $RF_{out}=[(2KR_L/2R_L)(R+R_{SUB})/(R^2/2R_L+R_{SUB}^2/2R_L+2R_LR/2R_L)]+0j$ $RF_{out}=K(R_{SUB}+R)/R=140K/20=7K$, and since $I_L=0$, then $I_I=-I_Q=[V_I/(R-jX_{CIPA}-jX_{CI})]=[(K(1-j)-RF_{out})/(R-jX_{CIPA}-jX_{CI})]$, then $I_I=-I_Q=[(K(1-j)-7K)/(20-j20j100)]=-(6K+jK)/(20-j120)=-jK/20$ $DET_A=RF_{out}+I_I(jX_{CI})=7K+(-jK/20)(-j100)=2K$, and $DET_B=RF_{out}+I_Q(jX_{LQ})=7K+(jK/20)(j100)=2K$.         Eq. 6

Therefore, the first and second detection signals ($DET_A$, $DET_B$) are in phase with each other and have the same amplitude.

Details of the above calculations are provided below for clarity:

$RF_{out}/R_L=[(K(1-j)-RF_{out})/(R-jX_{CIPA}-jX_{CI})]+[(K(1+j)-RF_{out})/(R+jX_{LQPA}+jX_{LQ})]$ from above and solving for $RF_{out}$, then $RF_{out}/R_L=[(K(1-j)-RF_{out})/(R-jR_{SUB})]+[(K(1+j)-RF_{out})/(R+jR_{SUB})]$, then $RF_{out}/R_L=[(K(1-j)-RF_{out})(R+jR_{SUB})/(R-jR_{SUB})(R+jR_{SUB})]+[(K(1+j)-RF_{out})(R-jR_{SUB})/(R+jR_{SUB})(R-jR_{SUB})]$, then $RF_{out}/R_L=[KR-jKR+jKR_{SUB}+KR_{SUB}-R(RF_{out})-j(R_{SUB})(RF_{out})+KR+jKR-R(RF_{out})-jKR_{SUB}+KR_{SUB}+j(R_{SUB})(RF_{out})]/(R^2+R_{SUB}^2)$, then $RF_{out}/R_L=[2KR+2KR_{SUB}-2R(RF_{out})]/(R^2+R_{SUB}^2)$, then $RF_{out}(R^2+R_{SUB}^2)=2R_L[KR+KR_{SUB}-R(RF_{out})]$, then $RF_{out}(R^2+R_{SUB}^2+2R_LR)=2KR_L(R+R_{SUB})$, therefore $RF_{out}=[2KR_L(R+R_{SUB})/(R^2+R_{SUB}^2+2R_LR)]+0j$.     Eq. 7

In the example when $R_L=R_L$ ideal=50 ohms, then $R_{SUB}=2R_L+R$, then $RF_{out}=[2KR_L(R+R+2R_L)/(R^2+(R+2R_L)^2+2R_LR)]$, then $RF_{out}=[2KR_L(2R+2R_L)/(R^2+R^2+4R_LR+4R_L^2+2R_LR)]$, then $RF_{out}=[2KR_L(2R+2R_L)/(2R^2+6R_LR+4R_L^2)]$, then $RF_{out}=[2KR_L(2R+2R_L)/(2R+2R_L)(R+2R_L)]$, then $RF_{out}=[2KR_L/(R+2R_L)]=[2KR_L/(R_{SUB})]$.     Eq. 8

Also, solving for $I_I$ and $I_Q$, then:

$I_I=V_I/(R-jX_{CIPA}-jX_{CI})=(K(1-j)-RF_{out})/(R-jX_{CIPA}-jX_{CI})$, then $I_I=(K(1-j)-2KR_L/(R_{SUB}))/(R-jR_{SUB})$ then $I_I=[(K(1-j)-2KR_L/(R_{SUB}))(R+jR_{SUB})]/[(R-jR_{SUB})(R+jR_{SUB})]$, then $I_I=[K_R+jKR_{SUB}-jKR+KR_{SUB}-(2KRR_L/R_{SUB})-j2KR_L]/(R^2+R_{SUB}^2)$, then substituting $R_{SUB}=2R_L+R$, then $I_I=K[R+j(2R_L+R)-jR+R_{SUB}-(2RR_L/R_{SUB})-j2R_L]/(R^2+R_{SUB}^2)$, then $I_I=K[R+R_{SUB}-2RR_L/R_{SUB}]/(R^2+R_{SUB}^2)$, then $I_I=(K/R_{SUB})(RR_{SUB}+R_{SUB}^2-2RR_L)/(R^2+R_{SUB}^2)$, then $I_I=(K/R_{SUB})(R(2R_L+R)+R_{SUB}^2-2RR_L)/(R^2+R_{SUB}^2)$, then $I_I=(K/R_{SUB})(R^2+R_{SUB}^2)/(R^2+R_{SUB}^2)$, then $I_I=(K/R_{SUB})$, then $I_Q=I_L-I_I=(2K/R_{SUB})-(K/R_{SUB})=(K/R_{SUB})$.     Eq. 9

Figure 4:
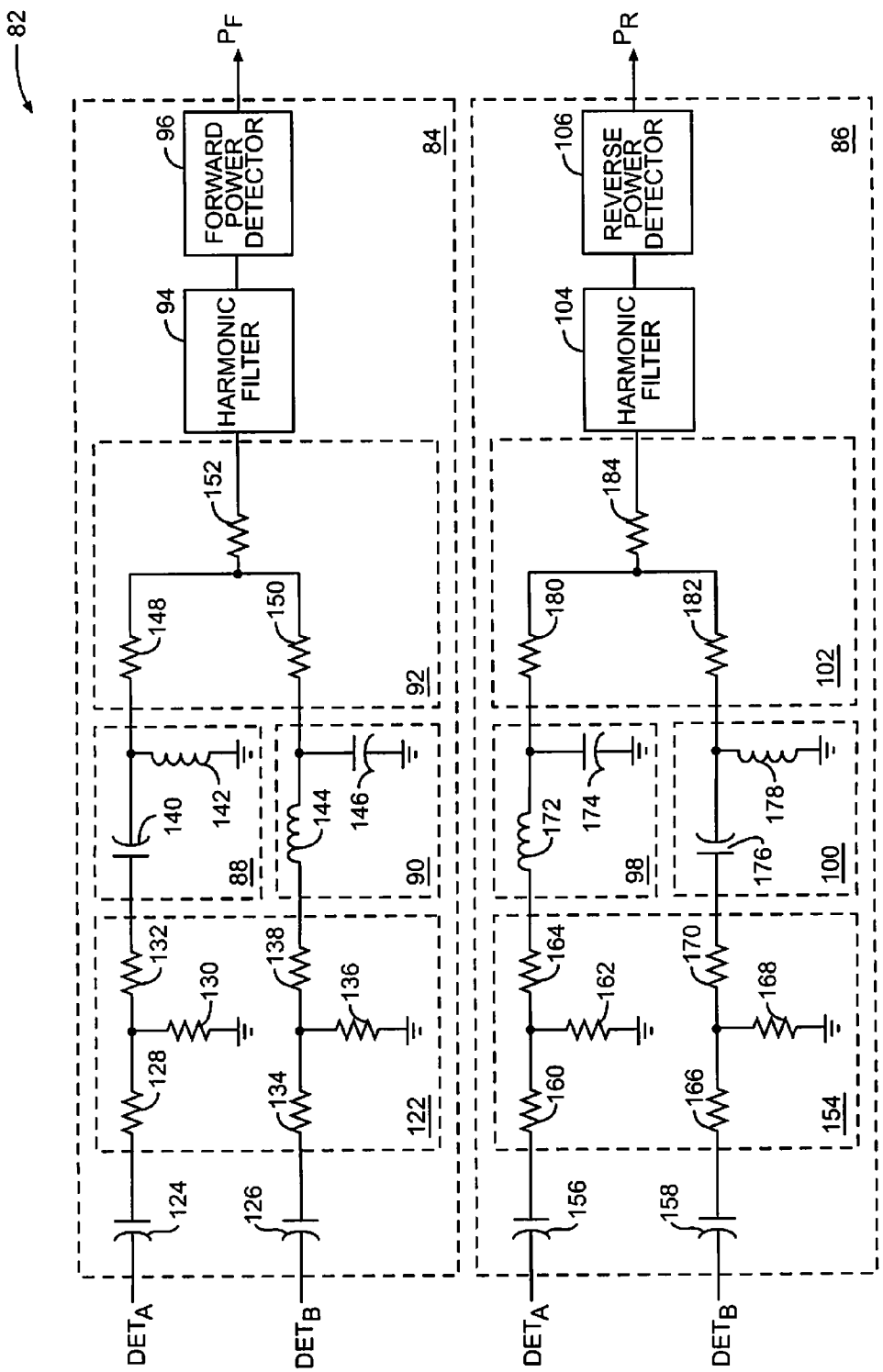
FIG. 4 is a more detailed illustration of an exemplary embodiment of the circuitry for detecting forward and reverse power of FIG. 2 according to one embodiment of the present invention.

FIG. 4 is a more detailed illustration of an exemplary embodiment of the power detection system 82 of FIG. 2. The forward power detection system 84 includes an attenuator network 122, the phase shift circuits 88, 90, the power combiner 92, the harmonic filter 94, and the forward power detector 96. The first and second detection signals ($DET_A$, $DET_B$) are coupled to the phase shift circuits 88, 90 via RF coupling capacitors 124, 126 and the attenuator network 122. The attenuator network 122 is optional and may be desired to adjust the levels of the first and second detection signals ($DET_A$, $DET_B$) to compensate for any amplitude imbalance inherent in the quadrature splitter 54 (FIG. 2). In this embodiment, the attenuator network 122 is formed by resistors 128-138 arranged as shown. However, the illustrated embodiment of the attenuator network 122 is exemplary and is not intended to limit the scope of the present invention. Numerous alternative embodiments of the attenuator network 122 will be apparent to one of ordinary skill in the art upon reading this disclosure.

The +45 degree phase shift circuit 88 is formed by a capacitor 140 and inductor 142 arranged as shown. The −45 degree phase shift circuit 90 is formed by an inductor 144 and capacitor 146 arranged as shown. The power combiner 92 is a resistor power combiner formed by resistors 148-152 arranged as shown. The illustrated embodiments of the phase shift circuits 88, 90 and the power combiner 92 are exemplary and are not intended to limit the scope of the present invention. Numerous alternative embodiments will be apparent to one of ordinary skill in the art upon reading this disclosure. In a similar fashion, the reverse power detection system 86 includes an attenuator network 154, the phase shift circuits 98, 100, the power combiner 102, the harmonic filter 104, and the reverse power detector 106. The first and second detection signals ($DET_A$, $DET_B$) are coupled to the phase shift circuits 98, 100 via RF coupling capacitors 156, 158 and the attenuator network 154. The attenuator network 154 is optional and may be desired to adjust the levels of the first and second detection signals ($DET_A$, $DET_B$) to compensate for any amplitude imbalance inherent in the quadrature splitter 54 (FIG. 2). In this embodiment, the attenuator network 154 is formed by resistors 160-170 arranged as shown. However, the illustrated embodiment of the attenuator network 154 is exemplary and is not intended to limit the scope of the present invention. Numerous alternative embodiments of the attenuator network 154 will be apparent to one of ordinary skill in the art upon reading this disclosure.

The −45 degree phase shift circuit 98 is formed by an inductor 172 and capacitor 174 arranged as shown. The +45 degree phase shift circuit 100 is formed by a capacitor 176 and inductor 178 arranged as shown. The power combiner 102 is a resistor power combiner formed by resistors 180-184 arranged as shown. The illustrated embodiments of the phase shift circuits 98, 100 and the power combiner 102 are exemplary and are not intended to limit the scope of the present invention. Numerous alternative embodiments will be apparent to one of ordinary skill in the art upon reading this disclosure.

Figure 5:
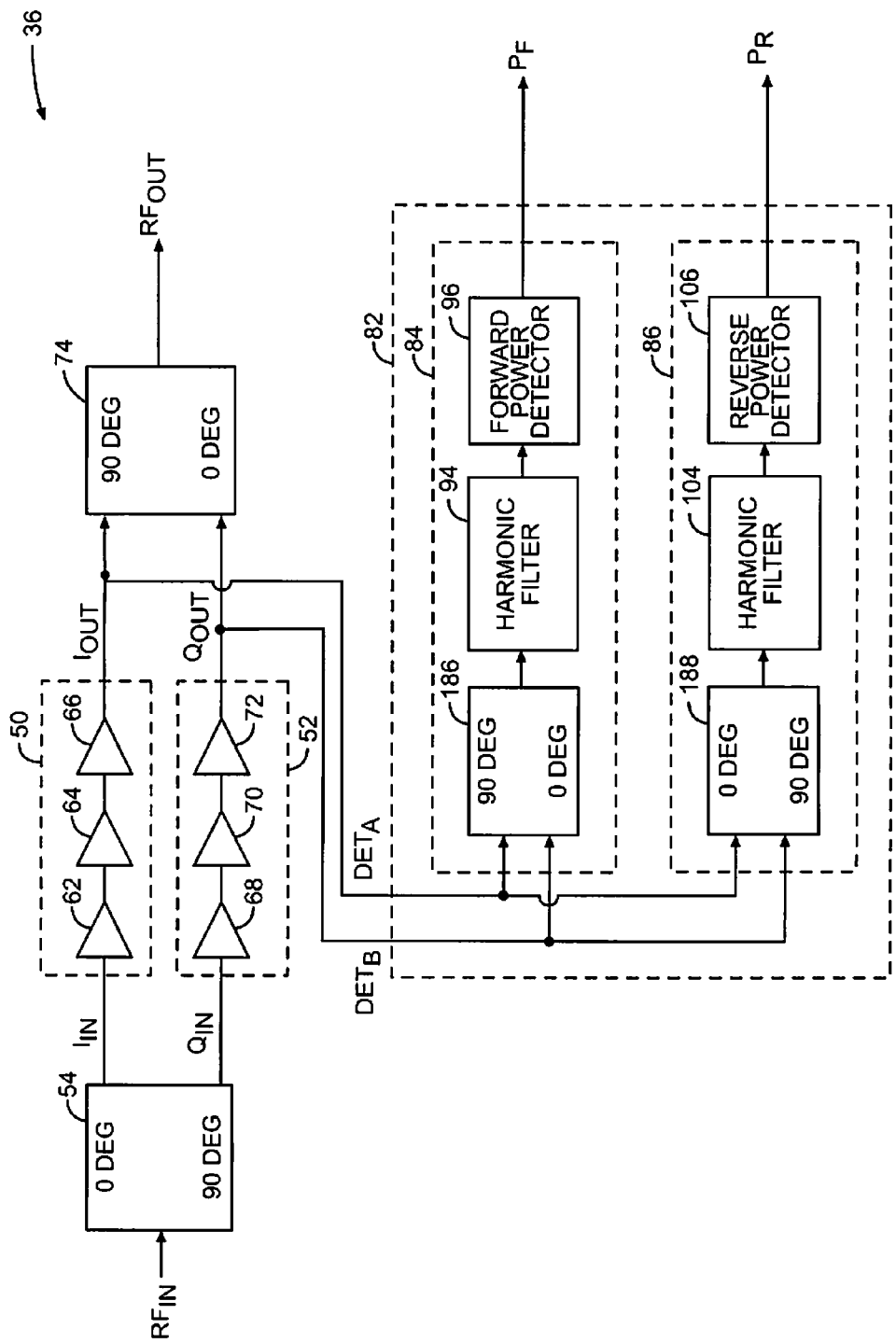
FIG. 5 illustrates power amplifier circuitry including circuitry for detecting forward and reverse power according to a second embodiment of the present invention.

FIG. 5 illustrates another embodiment of the power amplifier circuitry 36 of the present invention. This embodiment is similar to that shown in FIG. 2. However, in this embodiment, the quadrature splitter 54 and quadrature combiner 74 are each implemented as 90 degree hybrid circuits. Also, the phase shift circuits 88, 90 and the power combiner 92 (FIG. 2) are replaced by a 90 degree hybrid circuit 186, and the phase shift circuits 98, 100 and the power combiner 102 (FIG. 2) are replaced by a 90 degree hybrid circuit 188. Although the implementation is different, the operation of the power detection system 82 is essentially the same as described above.

More specifically, the 90 degree hybrid circuit 186 shifts the first detection signal ($DET_A$) by +90 degrees, but does not shift the second detection signal ($DET_B$). As a result, the forward components of the first and second detection signals ($DET_A$, $DET_B$) are in-phase, and the reverse components of the first and second detection signals ($DET_A$, $DET_B$) are 180 degrees out-of-phase. As a result, the 90 degree hybrid circuit 186 provides a signal indicative of only forward power. Similarly, the 90 degree hybrid circuit 188 does not shift the first detection signal ($DET_A$), but shifts the second detection signal ($DET_B$) by +90 degrees. As a result, the reverse components of the first and second detection signals ($DET_A$, $DET_B$) are in-phase, and the forward components of the first and second detection signals ($DET_A$, $DET_B$) are 180 degrees out-of-phase. As a result, the 90 degree hybrid circuit 188 provides a signal that is indicative of only reverse power.

Those skilled in the art will recognize improvements and modifications to the preferred embodiments of the present invention. All such improvements and modifications are considered within the scope of the concepts disclosed herein and the claims that follow.

What is claimed is:

1. A system for detecting both forward and reverse power at an output of power amplifier circuitry comprising:
   a quadrature combiner circuit adapted to:
      receive a first amplifier signal from an output of an in-phase amplifier leg of the power amplifier circuitry and a second amplifier signal from an output of a quadrature-phase amplifier leg of the power amplifier circuitry, wherein the second amplifier signal is phase-shifted essentially 90 degrees from the first amplifier signal;
      phase shift at least one of the first and second amplifier signals to provide a third amplifier signal and a fourth amplifier signal wherein the third amplifier signal is essentially in-phase with the fourth amplifier signal; and
      combine the third amplifier signal and the fourth amplifier signal to provide the output of the power amplifier circuitry;
   a forward power detection circuit adapted to:
      phase shift at least one of the first and second amplifier signals to provide a first forward detection signal and a second forward detection signal, wherein the first forward detection signal is essentially in-phase with the second forward detection signal;
      combine the first forward detection signal and the second forward detection signal to provide a combined forward detection signal; and
      filter the combined forward detection signal to remove effects of undesirable harmonics to provide a filtered combined forward detection signal; and
   a reverse power detection circuit adapted to:
      phase shift at least one of the first and second amplifier signals to provide a first reverse detection signal and a second reverse detection signal wherein the first reverse detection signal is essentially 180 degrees out of phase with the second reverse detection signal;
      combine the first reverse detection signal and the second reverse detection signal to provide a combined reverse detection signal; and
      filter the combined reverse detection signal to remove effects of undesirable harmonics to provide a filtered combined reverse detection signal.

2. The system of claim 1 wherein:
   to phase shift the at least one of the first and second amplifier signals to provide the third amplifier signal and the fourth amplifier signal, the quadrature combiner circuit is further adapted to phase shift both of the first and second amplifier signals to provide the third and fourth amplifier signals, wherein a phase shift value applied to the first amplifier signal differs from a phase shift value applied to the second amplifier signal by essentially 90 degrees;
   to phase shift the at least one of the first and second amplifier signals to provide the first forward detection signal and the second forward detection signal, the forward power detection circuit is further adapted to phase shift both of the first and second amplifier signals to provide the first and second forward detection signals, wherein:
      a phase shift value applied to the first amplifier signal to provide the first forward detection signal is essentially identical to a phase shift value applied to the first amplifier signal to provide the third amplifier signal; and
      a phase shift value applied to the second amplifier signal to provide the second forward detection signal is essentially identical to a phase shift value applied to the second amplifier signal to provide the fourth amplifier signal; and
   to phase shift the at least one of the first and second amplifier signals to provide the first reverse detection signal and the second reverse detection signal, the reverse power detection circuit is further adapted to phase shift both of the first and second amplifier signals to provide the first and second reverse detection signals wherein:
      a phase shift value applied to the first amplifier signal to provide the first reverse detection signal is essentially equal in magnitude and opposite in polarity to the phase shift value applied to the first amplifier signal to provide the third amplifier signal; and
      a phase shift value applied to the second amplifier signal to provide the second reverse detection signal is essentially equal in magnitude and opposite in polarity to the phase shift value applied to the second amplifier signal to provide the fourth amplifier signal.

3. The system of claim 2 wherein:
   the phase shift value of the first amplifier signal to provide the third amplifier signal is essentially +45 degrees;
   the phase shift value of the second amplifier signal to provide the fourth amplifier signal is essentially −45 degrees;
   the phase shift value of the first amplifier signal to provide the first forward detection signal is essentially +45 degrees;
   the phase shift value of the second amplifier signal to provide the second forward detection signal is essentially −45 degrees;
   the phase shift value of the first amplifier signal to provide the first reverse detection signal is essentially −45 degrees; and
   the phase shift value of the second amplifier signal to provide the second reverse detection signal is essentially +45 degrees.

4. The system of claim 1 wherein:
   to phase shift the at least one of the first and second amplifier signals to provide the third amplifier signal and the fourth amplifier signal, the quadrature combiner circuit is further adapted to phase shift only the first amplifier signal to provide the third amplifier signal wherein a phase shift value applied to the first amplifier signal is essentially 90 degrees and the fourth amplifier signal is essentially in phase with the second amplifier signal;

to phase shift the at least one of the first and second amplifier signals to provide the first forward detection signal and the second forward detection signal, the forward power detection circuit is further adapted to phase shift only the first amplifier signal to provide the first forward detection signal, wherein:
a phase shift value applied to the first amplifier signal to provide the first forward detection signal is essentially identical to a phase shift value applied to the first amplifier signal to provide the third amplifier signal; and
the second forward detection signal is essentially in phase with the second amplifier signal; and
to phase shift the at least one of the first and second amplifier signals to provide the first reverse detection signal and the second reverse detection signal, the reverse power detection circuit is further adapted to phase shift only the second amplifier signal to provide the second reverse detection signal, wherein:
a phase shift value applied to the second amplifier signal to provide the second reverse detection signal is essentially identical to the phase shift value applied to the first amplifier signal to provide the third amplifier signal; and
the first reverse detection signal is essentially in phase with the first amplifier signal.

5. The system of claim 1 wherein:
to phase shift the at least one of the first and second amplifier signals to provide the third amplifier signal and the fourth amplifier signal, the quadrature combiner circuit is further adapted to phase shift only the second amplifier signal to provide the fourth amplifier signal, wherein a phase shift value applied to the second amplifier signal is essentially 90 degrees and the third amplifier signal is essentially in phase with the first amplifier signal;
to phase shift the at least one of the first and second amplifier signals to provide the first forward detection signal and the second forward detection signal, the forward power detection circuit is further adapted to phase shift only the second amplifier signal to provide the second forward detection signal, wherein:
a phase shift value applied to the second amplifier signal to provide the second forward detection signal is essentially identical to a phase shift value applied to the second amplifier signal to provide the fourth amplifier signal; and
the first forward detection signal is essentially in phase with the first amplifier signal; and
to phase shift the at least one of the first and second amplifier signals to provide the first reverse detection signal and the second reverse detection signal, the reverse power detection circuit is further adapted to phase shift only the first amplifier signal to provide the first reverse detection signal, wherein:
a phase shift value applied to the first amplifier signal to provide the first reverse detection signal is essentially identical to the phase shift value applied to the second amplifier signal to provide the fourth amplifier signal; and
the second reverse detection signal is essentially in phase with the second amplifier signal.

6. The system of claim 1 further comprising:
a quadrature splitter adapted to generate an in-phase radio frequency signal and a quadrature-phase radio frequency signal from a radio frequency input signal, wherein the in-phase radio frequency signal is phase-shifted from the quadrature-phase radio frequency signal by essentially 90 degrees;
the in-phase amplifier leg adapted to amplify the in-phase radio frequency signal to provide the first amplifier signal; and
the quadrature-phase amplifier leg adapted to amplify the quadrature-phase radio frequency signal to provide the second amplifier signal.

7. The system of claim 1 wherein:
the first amplifier signal comprises a first forward component indicative of an amplified in-phase radio frequency signal and a first reverse component indicative of a reflected signal, and the second amplifier signal comprises a second forward component indicative of an amplified quadrature-phase radio frequency signal and a second reverse component indicative of the reflected signal; wherein:
the first forward component is phase-shifted from the second forward component by essentially 90 degrees; and
the first reverse component is phase-shifted from the second reverse component by essentially 90 degrees in opposite polarity due to a phase shift of the quadrature combiner circuit;
the forward power detection circuit is further adapted to apply phase shift values to the first and second amplifier signals such that the forward components of the first and second amplifier signals are essentially in-phase and the reverse components of the first and second amplifier signals are essentially 180 degrees out-of-phase; and
the reverse power detection circuit is further adapted to apply phase shift values to the first and second amplifier signals such that the reverse components of the first and second amplifier signals are essentially in-phase and the forward components of the first and second amplifier signals are essentially 180 degrees out-of-phase.

8. The system of claim 1 wherein the forward power detection circuit comprises:
forward phase shift circuitry adapted to receive the first and second amplifier signals to phase shift the at least one of the first and second amplifier signals to provide the first forward detection signal and the second forward detection signal;
forward combiner circuitry adapted to combine the first and second forward detection signals to provide the combined forward detection signal;
harmonic filter circuitry adapted to remove the undesirable harmonics from the combined forward detection signal to provide the filtered combined forward detection signal; and
forward power detector circuitry to process the filtered combined forward detection signal to provide a signal indicative of forward power.

9. The system of claim 1 wherein the reverse power detection circuit comprises:
reverse phase shift circuitry adapted to receive the first and second amplifier signals to phase shift the at least one of the first and second amplifier signals to provide the first reverse detection signal and the second reverse detection signal;
reverse combiner circuitry adapted to combine the first and second reverse detection signals to provide the combined reverse detection signal;
harmonic filter circuitry to remove the undesirable harmonics from the combined reverse detection signal to provide the filtered combined reverse detection signal; and reverse power detector circuitry to process the filtered combined reverse detection signal to provide a signal indicative of reverse power.

10. The system of claim 1 wherein the forward power detection circuit further comprises power detection circuitry to process the filtered combined forward detection signal to provide a signal indicative of forward power.

11. The system of claim 1 wherein the forward power detection circuit further comprises harmonic filter circuitry adapted to remove the undesirable harmonics of the combined forward detection signal.

12. The system of claim 1 wherein the reverse power detection circuit further comprises power detection circuitry to process the filtered combined reverse detection signal to provide a signal indicative of reverse power.

13. The system of claim 1 wherein the reverse power detection circuit further comprises harmonic filter circuitry adapted to remove the undesirable harmonics of the combined reverse detection signal.

14. A system for detecting forward power at an output of power amplifier circuitry comprising:
a quadrature combiner circuit adapted to:
receive a first amplifier signal from an output of an in-phase amplifier leg of the power amplifier circuitry and a second amplifier signal from an output of a quadrature-phase amplifier leg of the power amplifier circuitry, wherein the second amplifier signal is phase-shifted essentially 90 degrees from the first amplifier signal;
phase shift at least one of the first and second amplifier signals to provide a third amplifier signal and a fourth amplifier signal wherein the third amplifier signal is essentially in-phase with the fourth amplifier signal; and
combine the third amplifier signal and the fourth amplifier signal to provide the output of the power amplifier circuitry; and
a forward power detection circuit adapted to:
phase shift at least one of the first and second amplifier signals to provide a first forward detection signal and a second forward detection signal, wherein the first forward detection signal is essentially in-phase with the second forward detection signal;
combine the first forward detection signal and the second forward detection signal to provide a combined forward detection signal; and
filter the combined forward detection signal to remove effects of undesirable harmonics to provide a filtered combined forward detection signal.

15. The system of claim 14 wherein:
to phase shift the at least one of the first and second amplifier signals to provide the third amplifier signal and the fourth amplifier signal, the quadrature combiner circuit is further adapted to phase shift both of the first and second amplifier signals to provide the third and fourth amplifier signals wherein a phase shift value applied to the first amplifier signal differs from a phase shift value applied to the second amplifier signal by essentially 90 degrees; and
to phase shift the at least one of the first and second amplifier signals to provide the first forward detection signal and the second forward detection signal, the forward power detection circuit is further adapted to phase shift both of the first and second amplifier signals to provide the first and second forward detection signals wherein:
a phase shift value applied to the first amplifier signal to provide the first forward detection signal is essentially identical to a phase shift value applied to the first amplifier signal to provide the third amplifier signal; and
a phase shift value applied to the second amplifier signal to provide the second forward detection signal is essentially identical to a phase shift value applied to the second amplifier signal to provide the fourth amplifier signal.

16. The system of claim 15 wherein:
the phase shift value of the first amplifier signal to provide the third amplifier signal is essentially +45 degrees;
the phase shift value of the second amplifier signal to provide the fourth amplifier signal is essentially −45 degrees;
the phase shift value of the first amplifier signal to provide the first forward detection signal is essentially +45 degrees; and
the phase shift value of the second amplifier signal to provide the second forward detection signal is essentially −45 degrees.

17. The system of claim 14 wherein:
to phase shift the at least one of the first and second amplifier signals to provide the third amplifier signal and the fourth amplifier signal, the quadrature combiner circuit is further adapted to phase shift only the first amplifier signal to provide the third amplifier signal, wherein a phase shift value applied to the first amplifier signal is essentially 90 degrees and the fourth amplifier signal is essentially in phase with the second amplifier signal; and
to phase shift the at least one of the first and second amplifier signals to provide the first forward detection signal and the second forward detection signal, the forward power detection circuit is further adapted to phase shift only the first amplifier signal to provide the first forward detection signal, wherein:
a phase shift value applied to the first amplifier signal to provide the first forward detection signal is essentially identical to a phase shift value applied to the first amplifier signal to provide the third amplifier signal; and
the second forward detection signal is essentially in phase with the second amplifier signal.

18. The system of claim 14 wherein:
to phase shift the at least one of the first and second amplifier signals to provide the third amplifier signal and the fourth amplifier signal, the quadrature combiner circuit is further adapted to phase shift only the second amplifier signal to provide the fourth amplifier signal wherein a phase shift value applied to the second amplifier signal is essentially 90 degrees and the third amplifier signal is essentially in phase with the first amplifier signal; and
to phase shift the at least one of the first and second amplifier signals to provide the first forward detection signal and the second forward detection signal, the forward power detection circuit is further adapted to phase shift only the second amplifier signal to provide the second forward detection signal, wherein:
a phase shift value applied to the second amplifier signal to provide the second forward detection signal is essentially identical to a phase shift value applied to the second amplifier signal to provide the fourth amplifier signal; and
the first forward detection signal is essentially in phase with the first amplifier signal.

19. The system of claim 14 wherein:
the first amplifier signal comprises a first forward component indicative of an amplified in-phase radio frequency signal and a first reverse component indicative of a reflected signal, and the second amplifier signal comprises a second forward component indicative of an amplified quadrature-phase radio frequency signal and a second reverse component indicative of the reflected signal; wherein:
the first forward component is phase-shifted from the second forward component by essentially 90 degrees; and
the first reverse component is phase-shifted from the second reverse component by essentially 90 degrees in opposite polarity due to a phase shift of the quadrature combiner circuit; and
the forward power detection circuit is further adapted to apply phase shift values to the first and second amplifier signals such that the forward components of the first and second amplifier signals are essentially in-phase and the reverse components of the first and second amplifier signals are essentially 180 degrees out-of-phase.

20. The system of claim 14 wherein the forward power detection circuit comprises:
forward phase shift circuitry adapted to receive the first and second amplifier signals to phase shift at least one of the first and second amplifier signals to provide the first forward detection signal and the second forward detection signal;
forward combiner circuitry adapted to combine the first and second forward detection signals to provide the combined forward detection signal;
harmonic filter circuitry to remove the undesirable harmonics from the combined forward detection signal to provide the filtered combined forward detection signal; and
forward power detector circuitry to process the filtered combined forward detection signal to provide a signal indicative of forward power.

* * * * *